(12) United States Patent
Sakai

(10) Patent No.: US 7,242,031 B2
(45) Date of Patent: Jul. 10, 2007

(54) SEMICONDUCTOR LIGHT EMITTING APPARATUS AND ITS MANUFACTURING METHOD

(75) Inventor: Takayuki Sakai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 11/067,760

(22) Filed: Mar. 1, 2005

(65) Prior Publication Data
US 2005/0230698 A1 Oct. 20, 2005

(30) Foreign Application Priority Data
Mar. 2, 2004 (JP) ............................. 2004-058197

(51) Int. Cl.
*H01L 33/00* (2006.01)
(52) U.S. Cl. .................. 257/98; 257/E33.068
(58) Field of Classification Search .................. 257/98
See application file for complete search history.

(56) References Cited
U.S. PATENT DOCUMENTS 6,036,328 A * 3/2000 Ohtsuki et al. ............. 362/612

2003/0132701 A1* 7/2003 Sato et al. .................. 313/503
2003/0178626 A1 9/2003 Sugiyama et al.
2004/0058533 A1 3/2004 Sakai et al.

FOREIGN PATENT DOCUMENTS

| JP | 3-16278 | 1/1991 |
|---|---|---|
| JP | 10-65220 | 3/1998 |
| JP | 2003-174191 | 6/2003 |

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

A semiconductor light emitting apparatus comprises: a semiconductor light emitting device; resin that seals the semiconductor light emitting device; and antireflective coating provided on a surface of the resin. The antireflective coating is made of material having an intermediate refractive index between the refractive index of the resin and the refractive index of air.

6 Claims, 22 Drawing Sheets

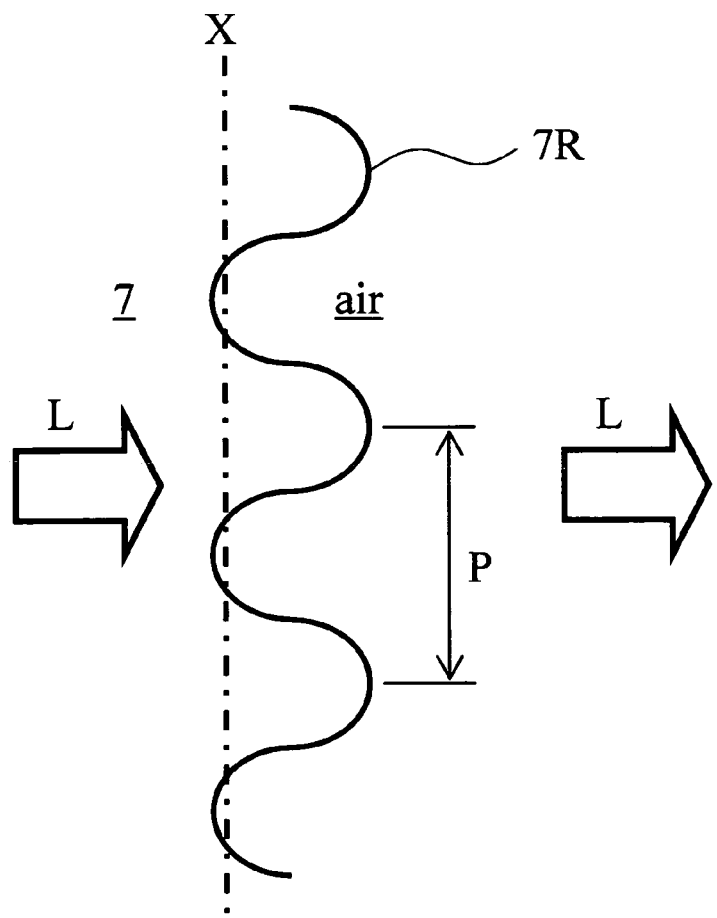
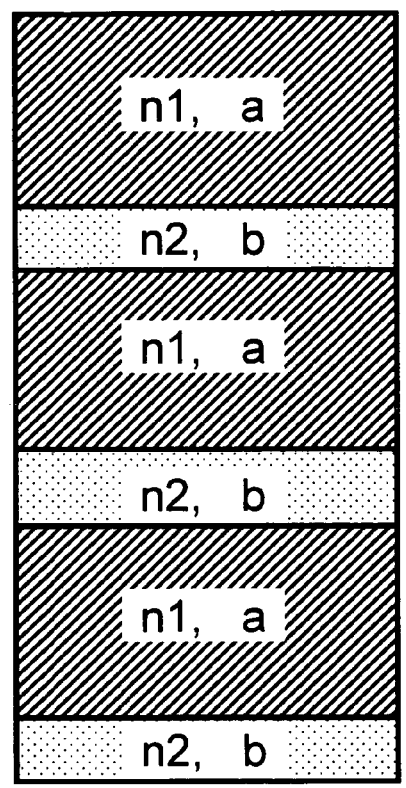
FIG. 5A                    FIG. 5B

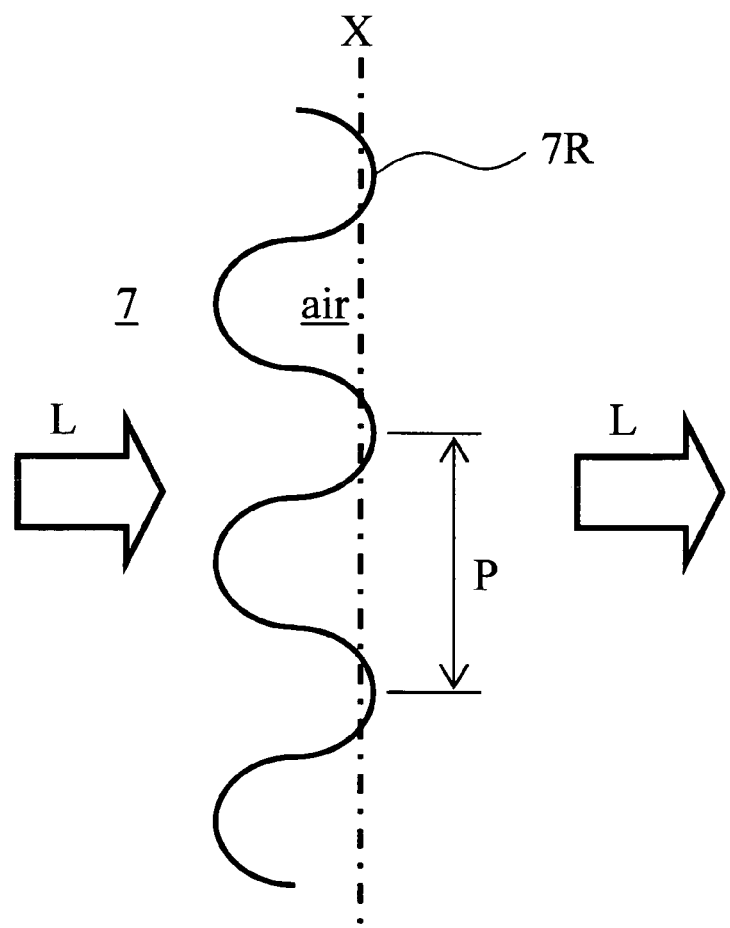
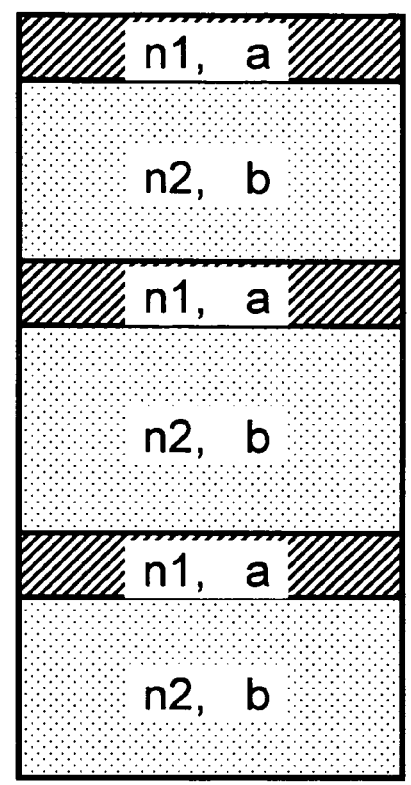
FIG. 7A
FIG. 7B

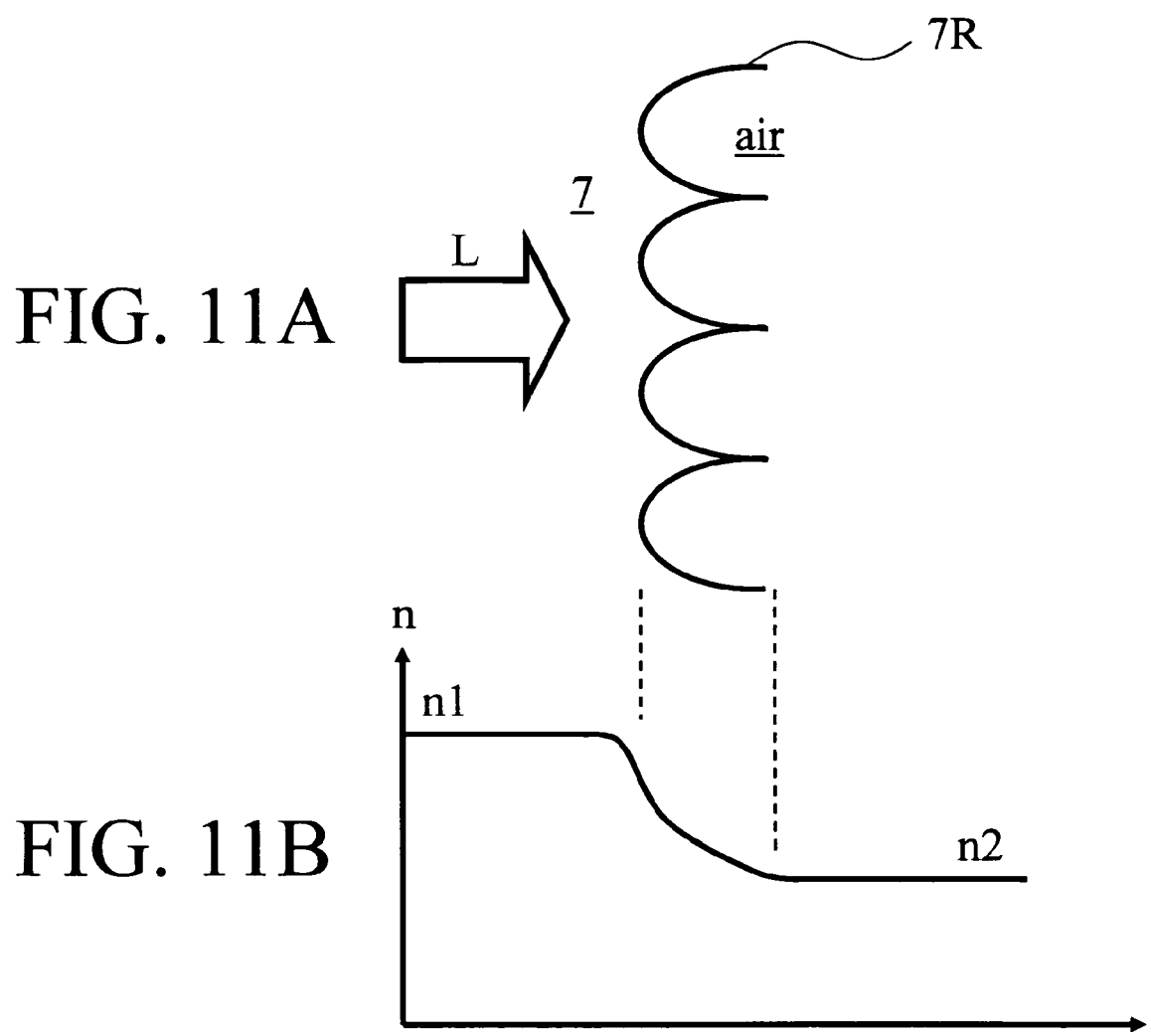

SEMICONDUCTOR LIGHT EMITTING APPARATUS AND ITS MANUFACTURING METHOD

CROSS-REFERENCE TO RELATED APPLICATIONS

This application is based upon and claims the benefit of priority from the prior Japanese Patent Application No. 2004-058197, filed on Mar. 2, 2004; the entire contents of which are incorporated herein by reference.

BACKGROUND OF THE INVENTION

The invention relates to a semiconductor light emitting apparatus and its manufacturing method, and more particularly, to a so-called mold-type semiconductor light emitting apparatus having a light emitting device sealed with resin, the semiconductor light emitting apparatus having improved extraction efficiency of light from the mold resin to the air and its manufacturing method.

One of the typical semiconductor light emitting apparatuses is a semiconductor light emitting apparatus having a semiconductor light emitting device such as LED (light emitting diode) or LD (laser diode) sealed with mold resin. Many of the compound semiconductors constituting such a semiconductor light emitting device have refractive index in the light emission wavelength region as high as about 3.2 to 3.7. On the other hand, the mold resin has refractive index as low as about 1.5. For this reason, since light emitted from the light emitting area is incident from the compound semiconductor layer having high refractive index on the mold resin having low refractive index, it is totally reflected at the interface with the mold resin for incident angles greater than the critical angle. This causes a problem of decreased light extraction efficiency. In this respect, total reflection can be suppressed by roughening the surface of the compound semiconductor (e.g., Japanese Laid-Open Patent Application 2003-174191).

As described above, optical transmittance from the semiconductor light emitting device to the mold resin can be improved.

However, with respect to light extraction from mold resin to the air, the transmittance is restricted by the difference between their refractive indices. Thus there is a problem that the light extraction efficiency is still low.

SUMMARY OF THE INVENTION

According to an aspect of the invention, there is provided a semiconductor light emitting apparatus comprising: a semiconductor light emitting device; resin that seals the semiconductor light emitting device; and antireflective coating provided on a surface of the resin, the antireflective coating being made of material having an intermediate refractive index between the refractive index of the resin and the refractive index of air.

According to another aspect of the invention, there is provided a semiconductor light emitting apparatus comprising: a semiconductor light emitting device; and resin that seals the semiconductor light emitting device, wherein at least a portion of the surface of the resin is provided with asperities having an average pitch less than ½ of a wavelength of light emitted through the resin.

According to another aspect of the invention, there is provided a method of manufacturing a semiconductor light emitting apparatus comprising: mounting a semiconductor light emitting device on a mounting member; molding the semiconductor light emitting device by a resin having asperities on at least a part of a surface thereof, the asperities having an average pitch less than ½ of a wavelength of light emitted through the resin.

BRIEF DESCRIPTION OF THE DRAWINGS

FIGS. 5 to 7 are conceptual diagrams for illustrating the change of widths a and b of the periodic structure;

FIGS. 10 and 11 are schematic diagrams showing another specific example of asperities 7R that can be provided in the second embodiment;

DETAILED DESCRIPTION

Embodiments of the invention will now be described with reference to the drawings.

Figure 1:
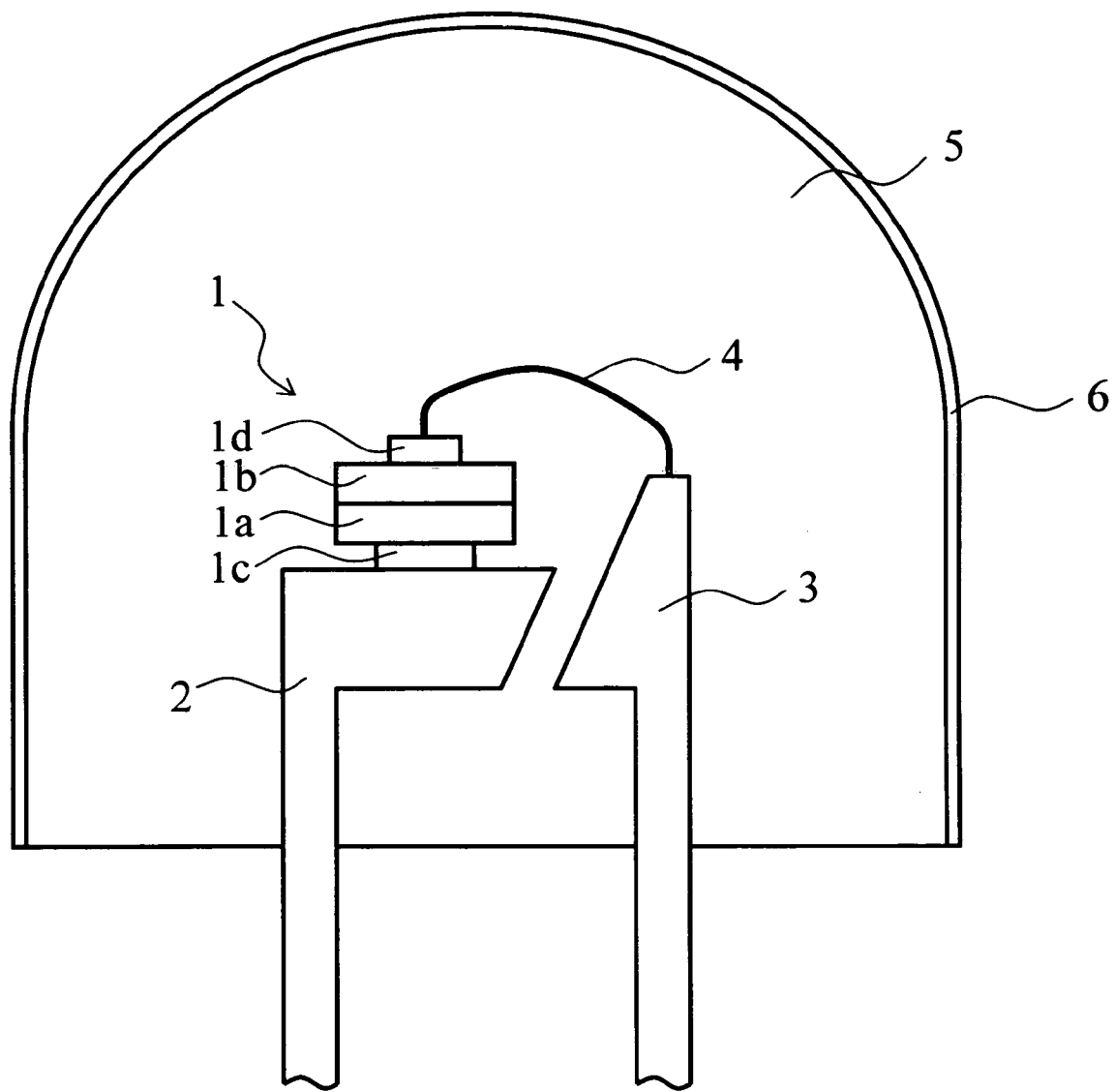
FIG. 1 is a schematic cross-sectional view showing a semiconductor light emitting apparatus according to a first embodiment of the invention.

FIG. 1 is a schematic cross-sectional view showing a semiconductor light emitting apparatus according to a first embodiment of the invention.

This semiconductor light emitting apparatus comprises a semiconductor light emitting device 1, a pair of leads 2 and 3, and sealing resin 5. More specifically, the semiconductor light emitting device 1 is mounted on the lead 2 as a mounting member with conductive adhesive or solder (not shown). The semiconductor light emitting device 1 has a structure in which a semiconductor layer 1b is stacked on a conductive crystal substrate 1a. An n-side electrode 1c is formed on the rear side of the conductive crystal substrate 1a. A p-side electrode 1d is formed on the upper surface of the semiconductor layer 1b. The n-side electrode 1c is bonded to the lead 2.

The p-side electrode 1d of the semiconductor light emitting device 1 is electrically connected with the lead 3 via a bonding wire 4. The semiconductor light emitting device 1 is sealed with mold resin 5 that serves for protection and lens function.

A p-n junction is formed in the semiconductor layer 1b of the semiconductor light emitting device 1. This junction area serves as a light emitting layer, from which light emission is obtained in an upward direction, with the upper surface of the n-type layer including the p-side electrode 1d acting as a light extraction surface. When a transparent substrate is used for the conductive crystal substrate 1a, light from the light emitting layer can be extracted also from the lower side.

In this embodiment, the surface of the mold resin 5 is provided with antireflective coating 6 having an intermediate value of refractive index between the refractive index of the mold resin 5 and that of air. The antireflective coating 6 has a refractive index and film thickness selected so as to decrease reflectance for light emitted from the semiconductor light emitting device 1. The reflectance of the antireflective coating 6 can be made close to zero if the following relation is satisfied:

$$2nT=(m-\tfrac{1}{2})\lambda \ (m \text{ is an integer})$$

where n is the refractive index of the antireflective coating 6, T is its film thickness, and λ is the wavelength of light emitted from the semiconductor light emitting device 1.

Here, the reflectance obtained when the antireflective coating 6 is provided can be described as follows.

Assuming that the mold resin 5 and the antireflective coating 6 have no light absorption, the amplitude reflectance $r_1$ at the interface between the mold resin 5 and the antireflective coating 6 and the amplitude reflectance $r_2$ at the interface between the antireflective coating 6 and air can be described by:

$$r_1 = \frac{n_1 - n_0}{n_1 + n_0}$$

$$r_2 = \frac{n_2 - n_1}{n_2 + n_1}$$

where $n_0$, $n_1$, and $n_2$ are the refractive indices of the mold resin 5, antireflective coating 6, and air, respectively.

Here, the overall amplitude reflectance r is given by:

$$r = \frac{r_1 + r_2 e^{i2\delta}}{1 + r_1 r_2 e^{i2\delta}}$$

$$\delta = \frac{2\pi n_1 T}{\lambda}$$

Therefore the reflectance R can be expressed as:

$$R = |r|^2 = \frac{r_1^2 + r_2^2 + 2r_1 r_2 \cos 2\delta}{1 + r_1^2 r_2^2 + 2r_1 r_2 \cos 2\delta}$$

Figure 2:
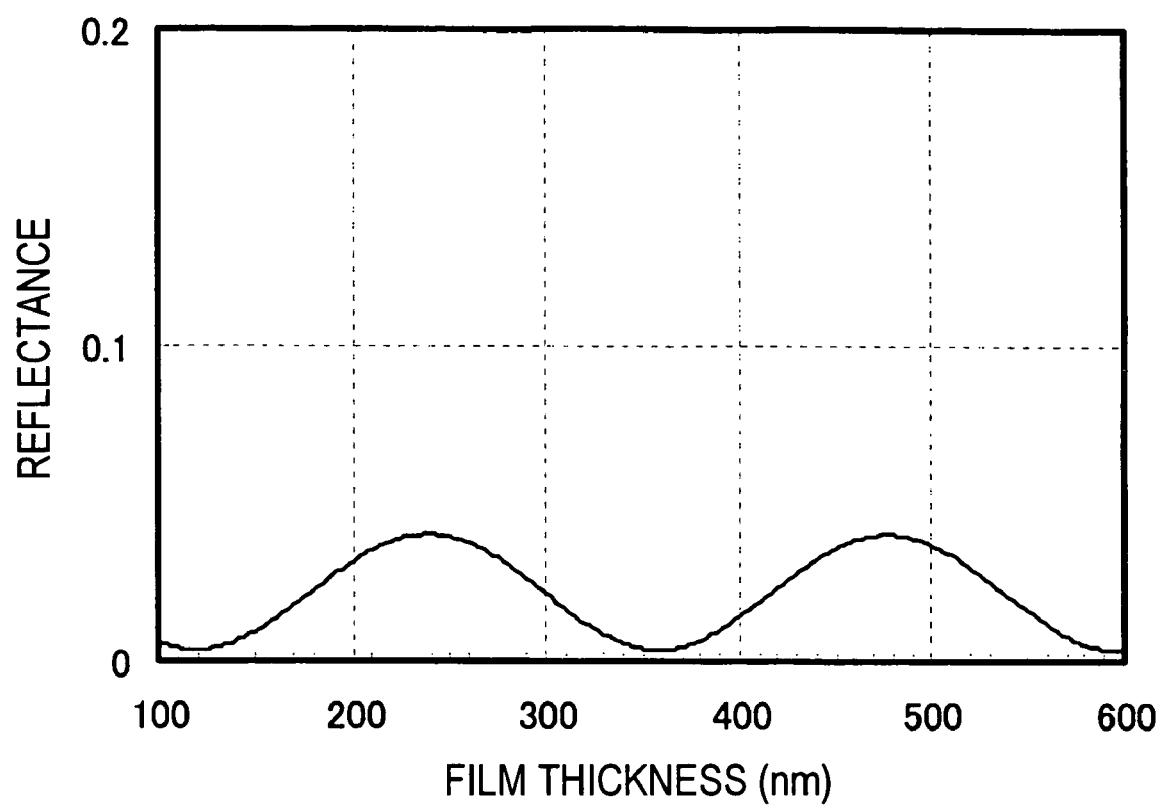
FIG. 2 is a graphical diagram illustrating the relationship between the film thickness of antireflective coating 6 and the reflectance.

FIG. 2 is a graphical diagram illustrating the relationship between the film thickness of antireflective coating 6 and the reflectance. More specifically, this figure shows the dependence of reflectance on the film thickness of the antireflective coating 6 that is obtained when the semiconductor light emitting device 1 has a light emission wavelength of 620 nanometers and the antireflective coating 6 is resin thin film having a refractive index of 1.3. Here, it is assumed that the refractive index $n_0$ of the mold resin 5 is 1.5, and the refractive index $n_2$ of air is 1.

As seen from FIG. 2, the reflectance can be significantly decreased when the film thickness of the antireflective coating 6 is 120, 355, or 600 nanometers. That is, in these cases, the optical transmittance from the mold resin 5 to the air is nearly 100%, and thus the light emission brightness can be improved.

However, the film thickness T of the antireflective coating 6 is not necessarily required to be a value that gives the minimal reflectance in FIG. 2. The film thickness T may be selected to generally conform to the following equation:

$$T=(m-\tfrac{1}{2})\lambda/2n \ (m \text{ is an integer})$$

in the range of the film thickness giving the minimal reflectance plus or minus about 30 nanometers.

The reflectance R can be minimized when the refractive index $n_1$ of the antireflective coating 6 has a value that satisfies or generally conforms to the following equation:

$$n_1 = \sqrt{n_0 n_2}$$

The antireflective coating 6 as described above can be formed by various methods such as vacuum evaporation, sputtering, CVD (chemical vapor deposition), and coating. In addition to polymer, the material of the antireflective coating 6 may be any of various oxides and fluorides such as silicon oxide ($SiO_x$) and magnesium fluoride ($MgF_2$).

Next, the second embodiment of the invention will be described.

Figure 3:
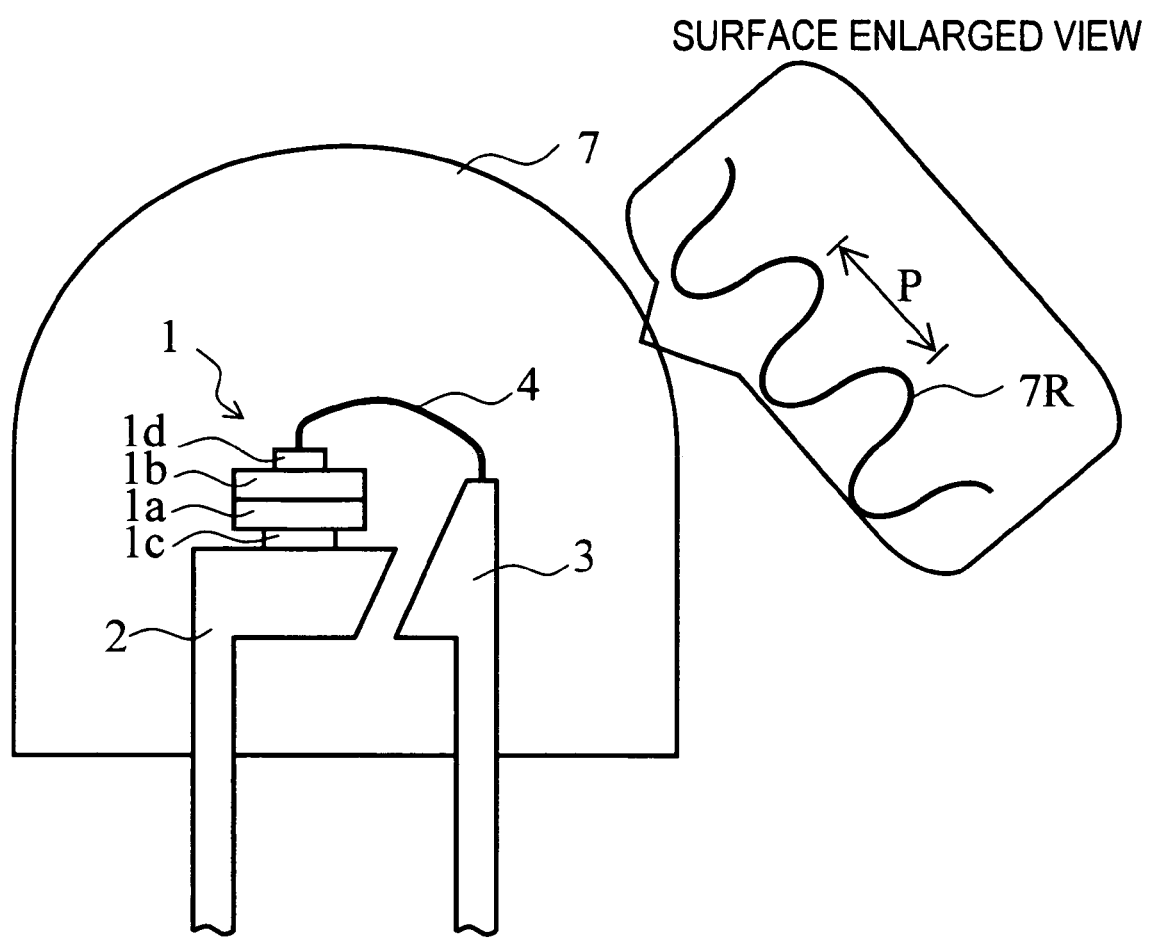
FIG. 3 is a schematic cross-sectional view showing a semiconductor light emitting apparatus according to a second embodiment of the invention.

FIG. 3 is a schematic cross-sectional view showing a semiconductor light emitting apparatus according to the second embodiment of the invention.

With respect to this figure, elements similar to those described with reference to FIG. 1 are marked with the same numerals and are not described in detail.

The basic configuration of the semiconductor light emitting apparatus of this embodiment is similar to that described above with reference to the first embodiment. The semiconductor light emitting device 1 is sealed with mold resin 7 that serves for protection and lens function. In this embodiment, fine asperities 7R are formed on the surface of the mold resin 7. The pitch P of the asperities 7R is set to be less than ½ of the light emission wavelength.

Such asperities 7R provided on the surface of the mold resin 7 yield a region in which the refractive index continuously varies from the refractive index of the mold resin 7 (about 1.5) to that of the air (about 1). This acts as a graded index, enabling the optical transmittance from the mold resin 7 to the air to be nearly 100 percent.

FIG. 4 is a conceptual diagram for illustrating the function of asperities 7R.

Figure 4A:
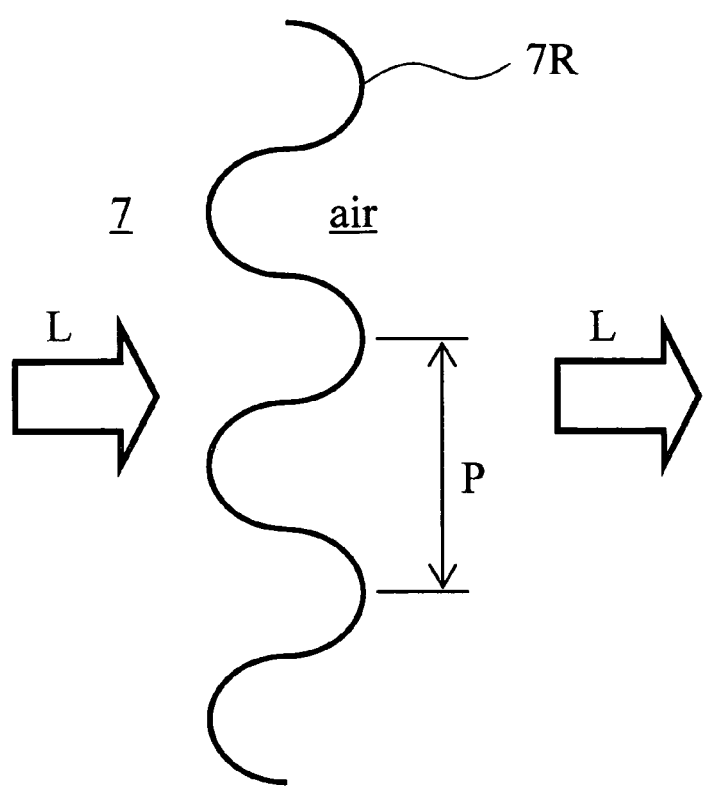
FIG. 4 is a conceptual diagram for illustrating the function of asperities 7R.

More specifically, in this embodiment, as shown in FIG. 4A, light L emitted from the semiconductor light emitting device 1 passes through the sealing resin 7, and is emitted into the air through the surface region in which the asperities 7R are formed. At this time, in the asperities 7R, the resin 7 (corresponding to projections of the resin 7) alternates with the air (corresponding to depressions of the resin 7).

Figure 4B:
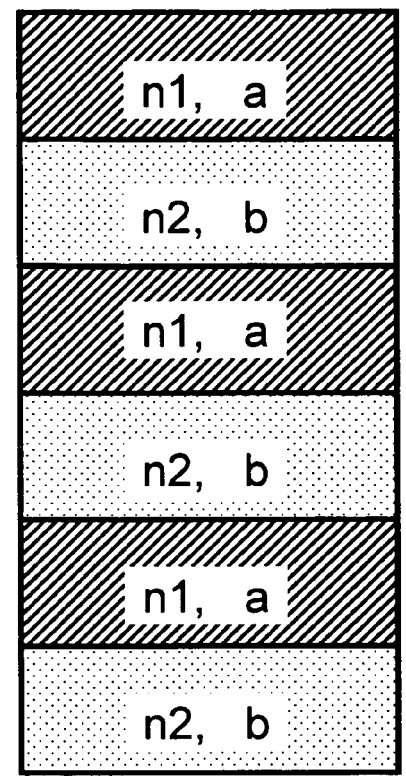

FIG. 4B is a conceptual diagram showing a periodic structure in which the resin 7 alternates with the air in this manner. More specifically, light L travels in a generally perpendicular direction relative to the repeat direction of the repetitive structure in which the resin 7 adjacently alternates with the air. In this case, assuming that the resin 7 (projections) has a refractive index of $n_1$ and a width of a, and the air (depressions) has a refractive index of $n_2$ and a width of b, the refractive index can be approximated by:

$$n = \sqrt{\frac{an_1^2 + bn_2^2}{a+b}} \quad (1)$$

when the widths a and b are sufficiently small as compared to the wavelength $\lambda$.

As seen from Equation (1), the average refractive index in the asperities 7R has an intermediate value between the refractive index $n_1$ of the resin 7 and the refractive index $n_2$ of the air.

In order for the approximation of Equation (1) to hold, the widths a and b of the respective layers must be smaller than the wavelength $\lambda$ so as to satisfy the following condition (S. M. Rytov, Sov. Phys. JETP 2 (1956) 466):

$$\tan\left(\frac{n_1 a}{\lambda}\pi\right) \cong \frac{n_1 a}{\lambda}\pi, \quad (2)$$
$$\tan\left(\frac{n_2 b}{\lambda}\pi\right) \cong \frac{n_2 b}{\lambda}\pi$$

Here, assuming that the refractive index $n_1$ of the resin 7 (projections) is $n_1$=1.5 and the refractive index $n_2$ of the air (depressions) is $n_2$=1, and that the pitch P=a+b, at least the condition of P/$\lambda$ being less than ½ is required.

In this embodiment, the widths a and b of the periodic structure shown in FIG. 4B are sequentially varied by forming the asperities 7R in a curved or oblique configuration.

FIGS. 5 to 7 are conceptual diagrams for illustrating the variation of widths a and b of the periodic structure.

More specifically, in a periodic structure along a cut line X near the bottom of the asperities 7R as shown in FIG. 5A, the width a of the resin 7 (projections) is larger and the width b of the air (depressions) is smaller as shown in FIG. 5B. As seen from Equation (1), the average refractive index n in this portion has a value close to the refractive index $n_1$ of the resin 7.

Figure 6A:
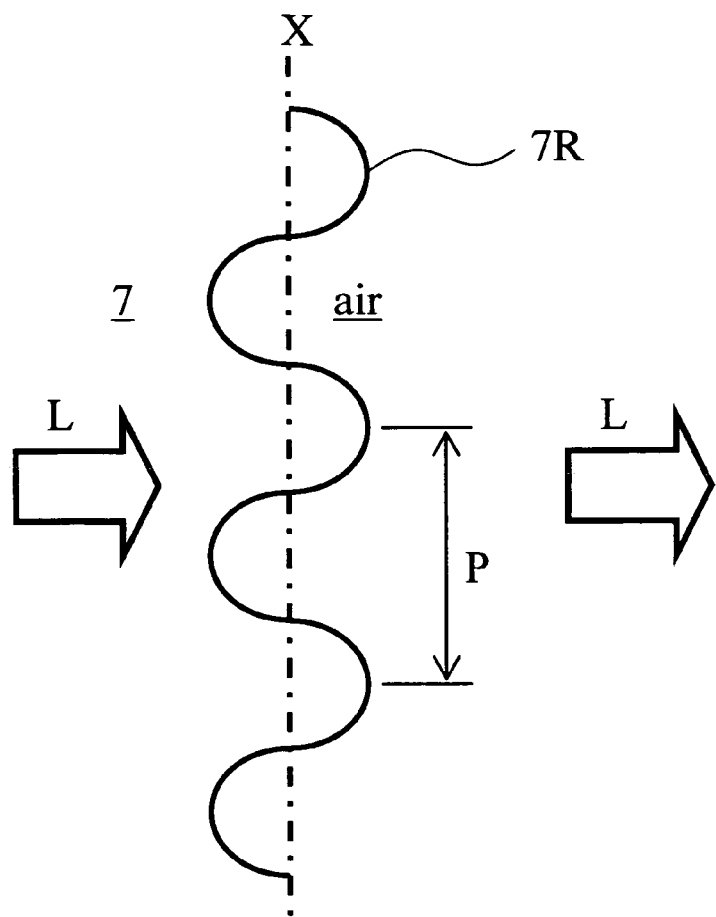
Figure 6B:
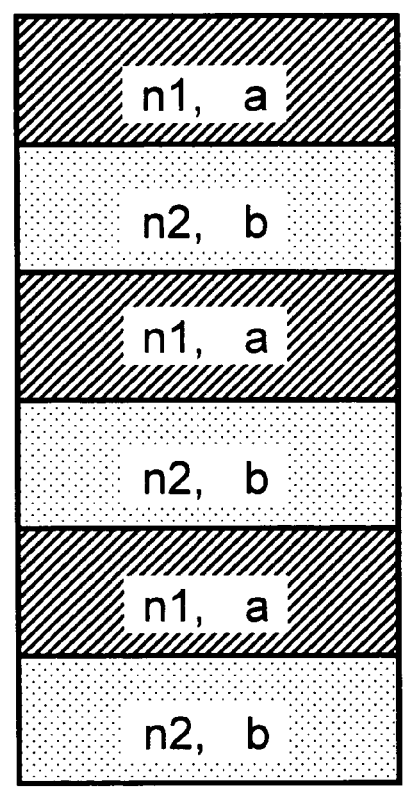

On the other hand, in a periodic structure along a cut line X about halfway through the asperities 7R as shown in FIG. 6A, the width a of the resin 7 (projections) is close to the width b of the air (depressions) as shown in FIG. 6B. That is, as seen from Equation (1), the average refractive index n in this portion has an intermediate value between the refractive index $n_1$ of the resin 7 and the refractive index $n_2$ of the air.

Furthermore, in a periodic structure along a cut line X near the tip of the asperities 7R as shown in FIG. 7A, the width b of the air (depressions) is larger than the width a of the resin 7 (projections) as shown in FIG. 7B. That is, as seen from Equation (1), the average refractive index n in this portion has a value closer to the refractive index $n_2$ of the air rather than the refractive index $n_1$ of the resin 7.

FIG. 8 is a schematic diagram for illustrating the distribution of effective refractive index for light L transmitted through such asperities 7R.

Figure 8A:
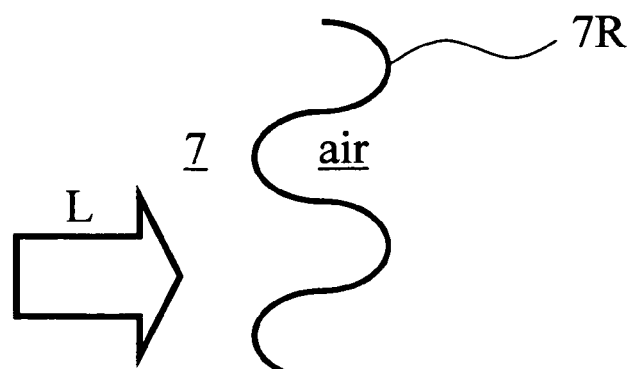
FIG. 8 is a schematic diagram for illustrating the distribution of effective refractive index for light L transmitted through the asperities 7R.
Figure 8B:
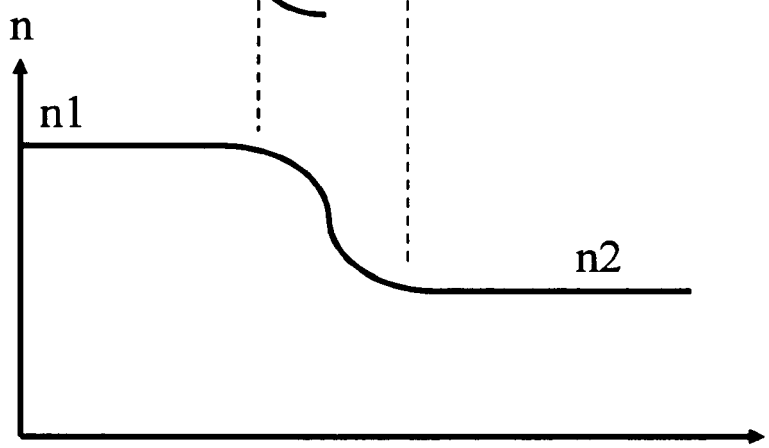

More specifically, when light L passes through the asperities 7R as shown in FIG. 8A, the effective refractive index n continuously varies from the refractive index $n_1$ of the resin 7 to the refractive index $n_2$ of the air in the asperities 7R as shown in FIG. 8B. That is, a "graded index" is formed here. In such a graded index structure having continuously varying refractive index, the reflectance of light can be significantly reduced.

To achieve a graded index structure, the asperities 7R may be formed in an oblique configuration rather than the curved configuration.

Figure 9A:
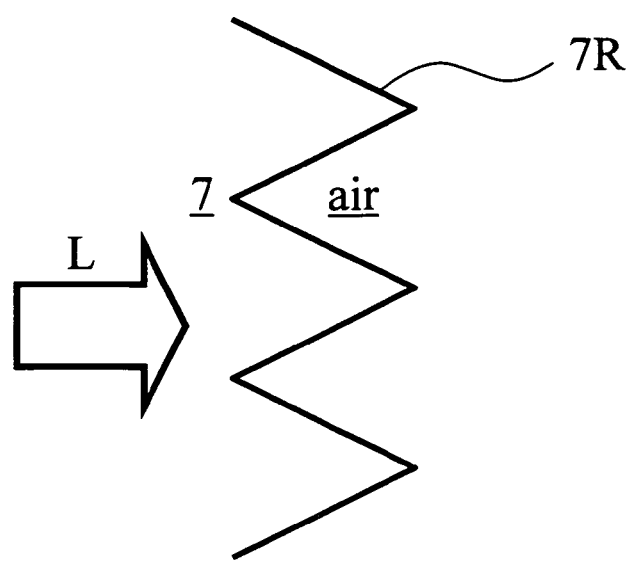
FIG. 9 is a schematic diagram illustrating the distribution of refractive index in oblique asperities 7R.
Figure 9B:
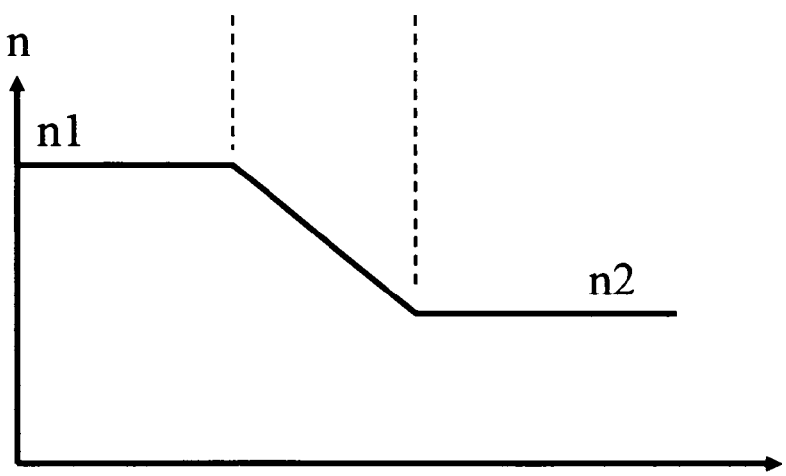

FIG. 9 is a schematic diagram illustrating the distribution of refractive index in oblique asperities 7R.

As shown in FIG. 9A, when asperities 7R are formed to have a cross section of generally oblique and linear configuration, the effective refractive index n also continuously varies from the refractive index $n_1$ of the resin 7 to the refractive index $n_2$ of the air in the asperities 7R. Therefore also in this case, a graded index structure is formed, and the reflectance for light L can be significantly reduced.

Figure 10A:
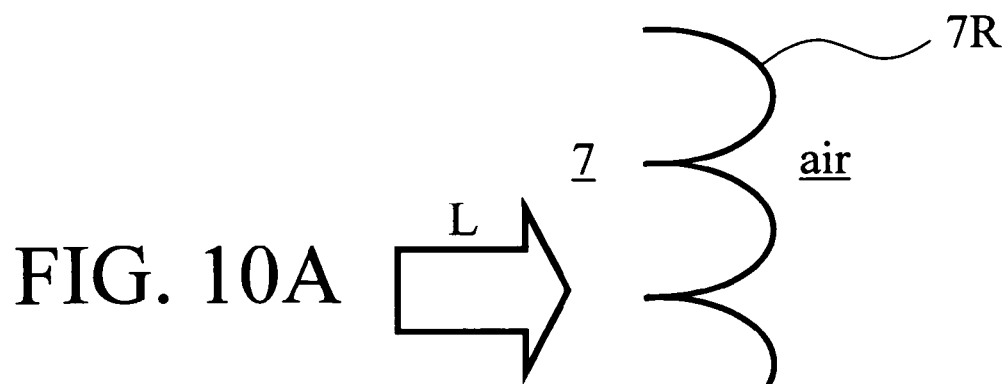
Figure 10B:
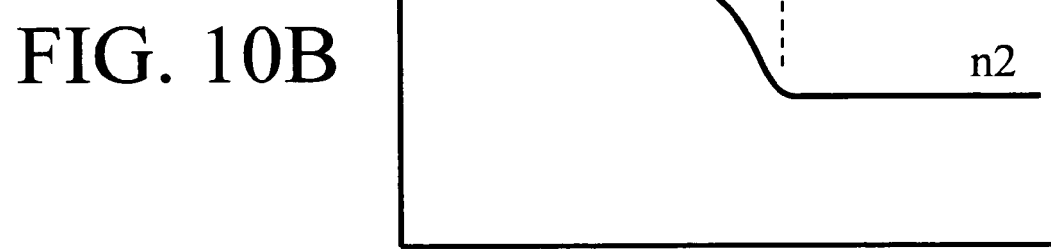

FIG. 10 is a schematic diagram showing another specific example of asperities 7R that can be provided in this embodiment. In this specific example, asperities 7R are formed in which projections protruding from the resin 7 toward the air are densely provided. With such asperities 7R, as shown in FIG. 10B, it is also possible to form a graded index that continuously varies from the refractive index $n_1$ of the resin 7 at the surface of the resin 7 to the refractive index $n_2$ of the air. As a result, the reflectance for light L can be significantly reduced.

FIG. 11 is a schematic diagram showing another specific example of asperities 7R that can be provided in this embodiment. In this specific example, asperities 7R are formed in which convex dimples formed from the side of the air toward the resin 7 are densely provided. With such asperities 7R, as shown in FIG. 11B, it is also possible to form a graded index.

Figure 12A:
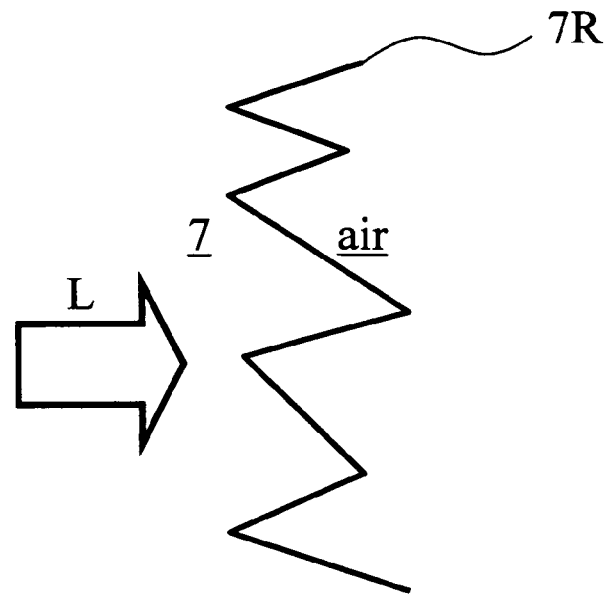
FIG. 12 is a schematic diagram showing a semiconductor light emitting apparatus in which projections or depressions of irregular shape are irregularly arranged.
Figure 12B:
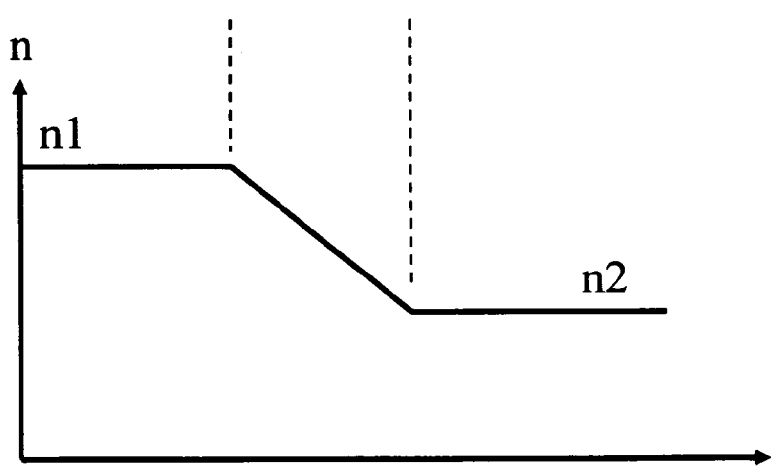

FIGS. 3 to 11 illustrate asperities 7R in which projections or depressions of fixed shape are periodically arranged. However, the invention is not limited thereto. That is, as shown in FIG. 12, the asperities 7R may be such that projections or depressions of irregular shape are irregularly arranged. The depressions or projections may be irregularly formed in a curved configuration, in addition to those illustrated in FIG. 12. With such irregular asperities 7R, the average refractive index also varies almost continuously from the resin 7 toward the air, and thus a graded index can be formed.

It should be noted that such irregular asperities 7R may be provided so that their average pitch is less than ½ of the light emission wavelength.

Figure 13A:
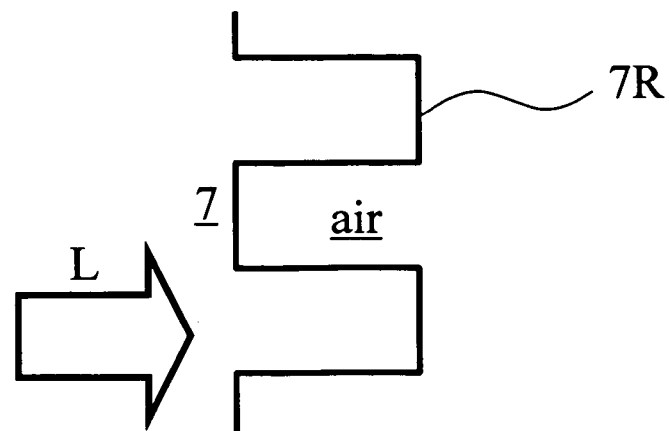
FIG. 13 is a schematic diagram showing a semiconductor light emitting apparatus having asperities 7R in which projections having a generally perpendicular side surface are periodically or irregularly arranged.
Figure 13B:
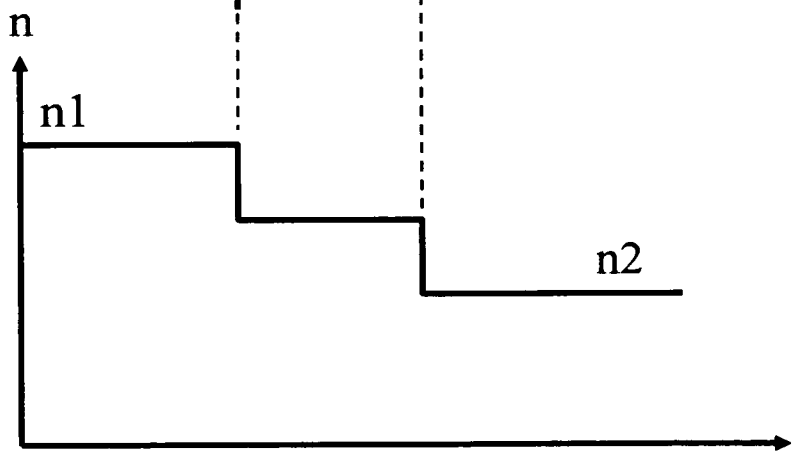

As illustrated in FIG. 13, it is also possible to provide asperities 7R in which projections having generally perpendicular side surfaces are arranged periodically or irregularly. In this case, the distribution of refractive index near the asperities 7R is as shown in FIG. 13B. More specifically, in the asperities 7R, the average refractive index given by Equation (1) has a nearly uniform distribution. That is, an intermediate refractive index between the refractive index of the resin 7 and that of the air is obtained. In this case, the refractive index is not continuously varied, but produces a jump in the distribution. However, an effect of reducing reflectance can be obtained by alleviating the difference of refractive index between the resin 7 and the air.

Next, a method of manufacturing a semiconductor light emitting apparatus of this embodiment will be described.

Figure 14:
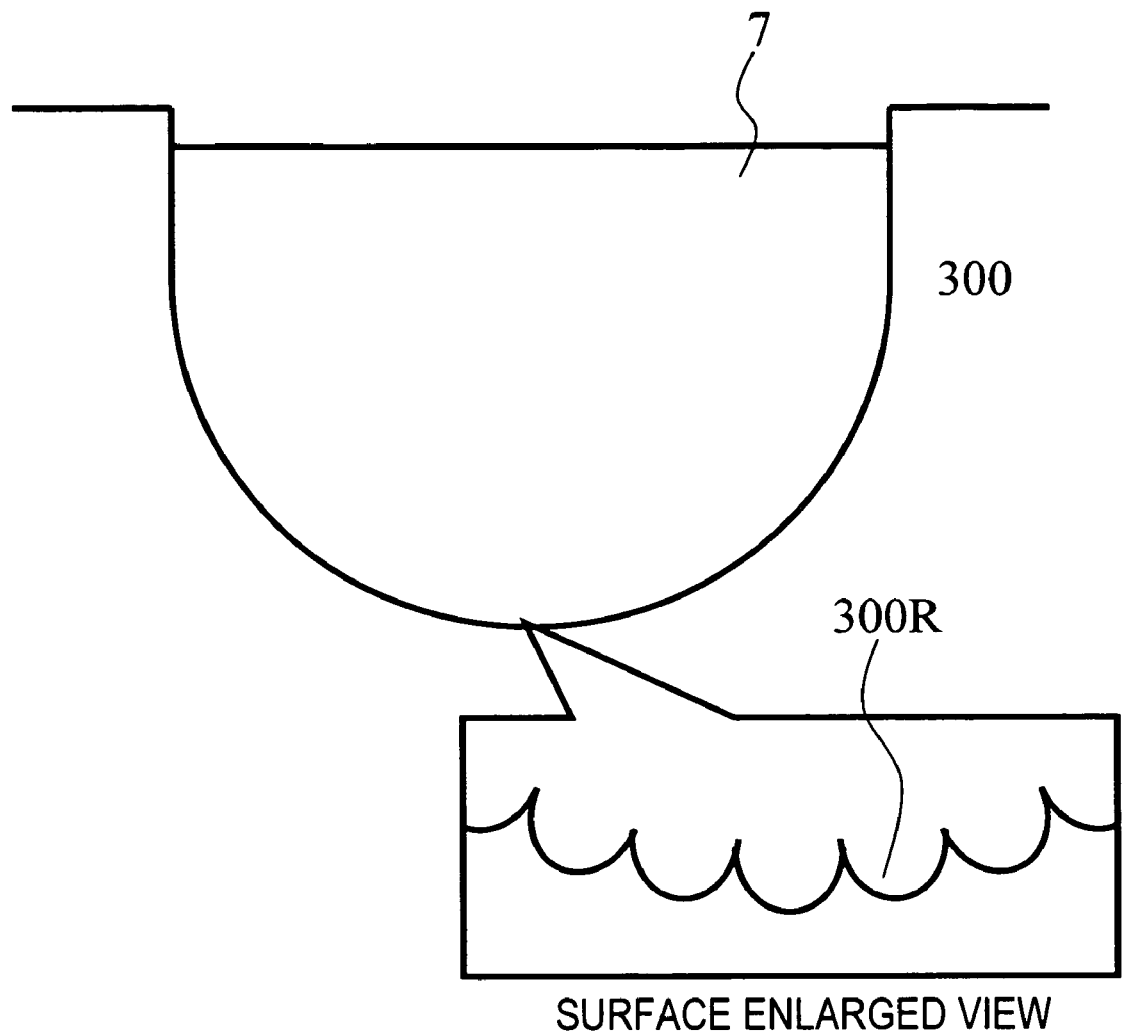
FIG. 14 is a schematic diagram showing the cross section of a mold that can be used for manufacturing a semiconductor light emitting apparatus of the second embodiment.

FIG. 14 is a schematic diagram showing the cross section of a mold that can be used for manufacturing a semiconductor light emitting apparatus of this embodiment. More specifically, the mold illustrated in this figure is used for molding resin 7 of the semiconductor light emitting apparatus. Molding of resin 7 can be carried out by various methods such as dipping and injection molding. For example, in the dipping method, fluid resin is poured into a mold 300, and the resin may be cured while the tip of leads 2 and 3 with the semiconductor light emitting device 1 mounted thereon is dipped in the resin.

In this embodiment, the inner surface of the mold 300 is provided with transfer asperities 300R in advance. This configuration can be transferred to the surface of the resin 7 to form the asperities 7R. It should be noted that the transfer asperities 300R illustrated in FIG. 14 correspond to those forming the asperities 7R shown in FIG. 10. In addition, however, the transfer asperities 300R corresponding to various configurations of asperities 7R described above with reference to FIGS. 3 to 13 can be provided on the mold 300 to form these asperities 7R.

Another method of providing asperities 7R on the surface of the resin 7 may be the nanoimprinting method, for example.

Figure 15:
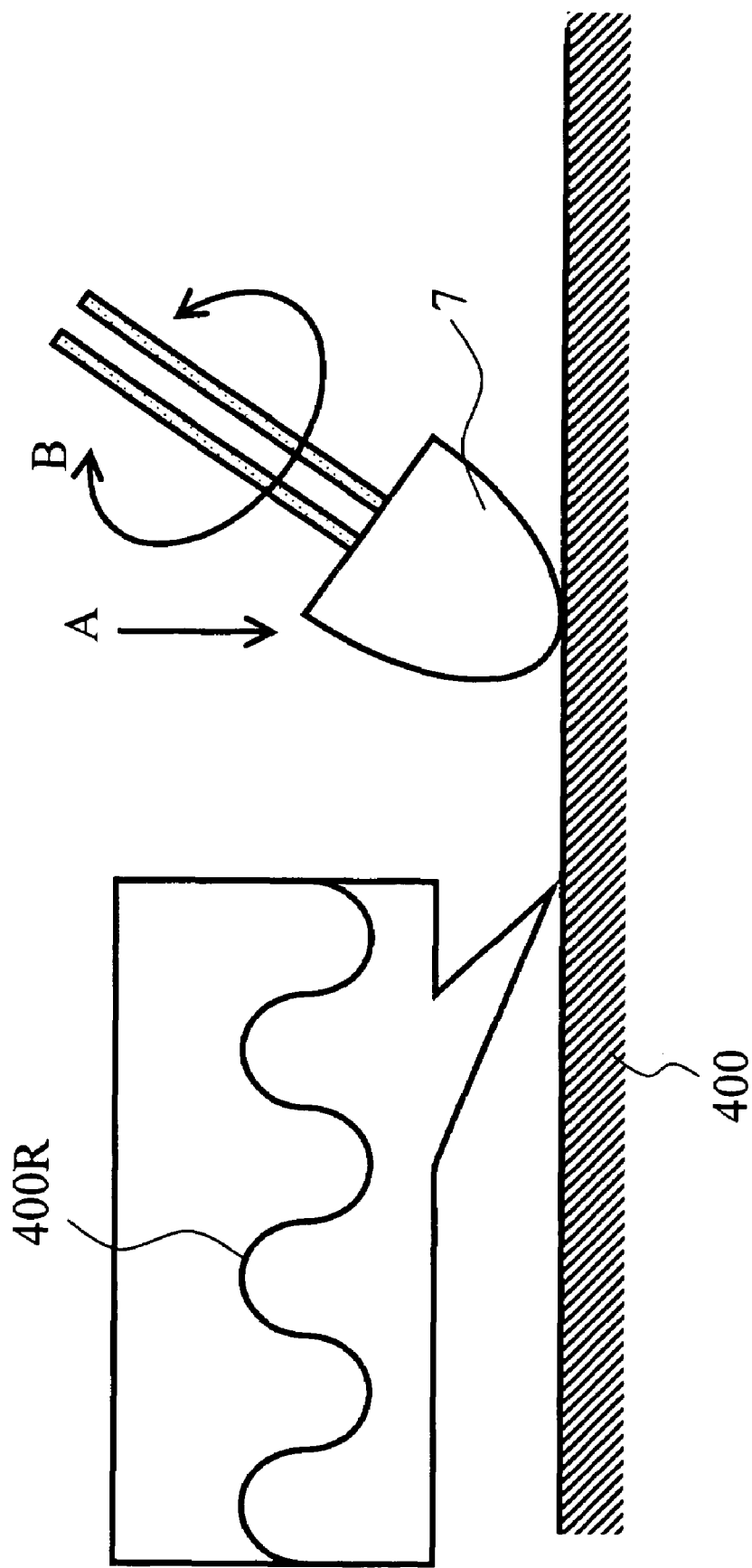
FIG. 15 is a conceptual diagram for illustrating the nanoimprinting method.

FIG. 15 is a conceptual diagram for illustrating the nanoimprinting method. More specifically, a stamper 400 is prepared. On the surface of the stamper 400, transfer asperities 400R corresponding to the asperities 7R to be formed on the resin 7 have been formed. The surface of the cured resin 7 is pressed onto the stamper 400, and thereby the transfer asperities 400R of the stamper 400 can be transferred to the surface of the resin 7 to form the asperities 7R. When a planar stamper 400 is used, for example, the resin 7 is rotated as appropriate as indicated by arrow B with being held down in the direction of arrow A. Thus the asperities 7R can be formed evenly on the overall surface of the generally bullet-shaped resin 7.

Alternatively, the stamper 400 may have a shape similar to the mold 300 shown in FIG. 14. More specifically, a hollow adapted to the shape of the resin 7 is prepared like the mold 300 shown in FIG. 14. On its inner wall surface, the transfer asperities 400R shown in FIG. 15 are formed. Cured resin 7 is then inserted into it and pressurized, and thereby the asperities 7R can be formed on the surface of the resin 7.

Another method of providing asperities 7R on the surface of the resin 7 may be etching with a mask. After the resin 7 is formed, a fine mask corresponding to the asperities 7R is formed on the surface of the resin 7. The resin 7 is then etched through the mask. In the embodiment of the invention, as described above with reference to Equations (1) and (2), the pitch of the asperities 7R is as fine as less than half of the light emission wavelength. In this respect, for example, block copolymer can be used to form the mask.

FIG. 16 is a process cross-sectional view showing part of the process using block copolymer.

Figure 16A:
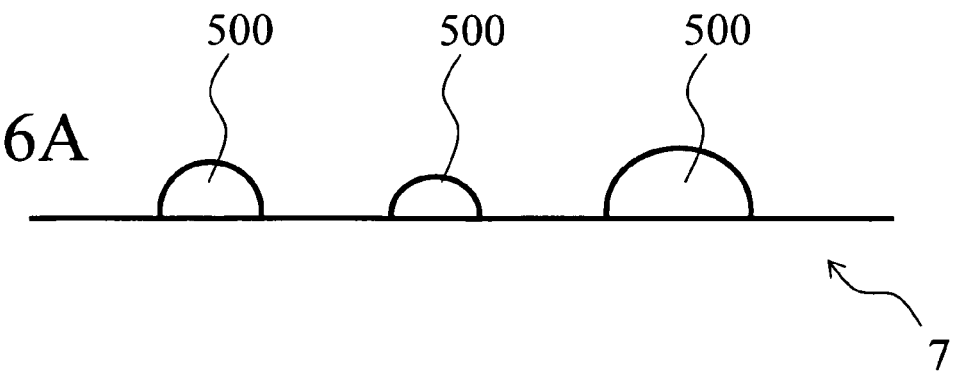
FIG. 16 is a process cross-sectional view showing part of the process using block copolymer.

More specifically, as shown in FIG. 16A, a mask 500 is formed on the surface of the resin 7. In particular, for example, the surface of the resin 7 is coated with solution of block copolymer composed of polystyrene (PS) and polymethyl methacrylate (PMMA) dissolved in solvent. The solvent is then volatilized by prebaking at 110° C. for 90 seconds, for example. Subsequently, by annealing in nitrogen atmosphere, PS and PMMA of the block copolymer are phase separated. At this time, the size of the phase-separated PS and PMMA can be set to about 100 nanometers, depending on the composition. The condition of annealing for phase separation may be determined as appropriate with respect to the temperature and time of annealing in view of the softening temperature of the resin 7.

Subsequently, the phase-separated block copolymer is etched by RIE (reactive ion etching) at a pressure of 1.33 pascals and a power of 100 watts under a flow of $CF_4$ at 30 sccm. The difference of etching rate between PS and PMMA results in selective etching of PMMA, forming a mask 500 of a fine pattern of PS on the surface of the resin 7 as shown in FIG. 16A.

Figure 16B:
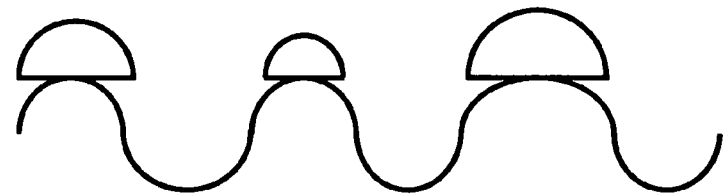

Subsequently, as shown in FIG. 16B, the resin 7 is etched through the mask 500. The method of etching may be either dry etching or wet etching.

Figure 16C:
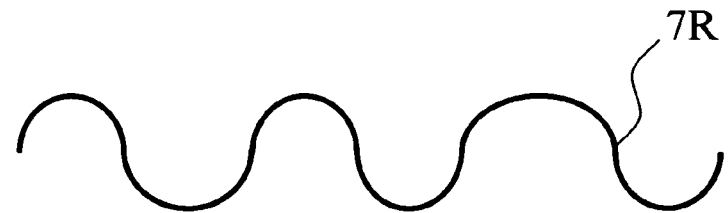

Subsequently, as shown in FIG. 16C, the resin 7 provided with asperities 7R is obtained by removing the mask 500. For the mask 500 made of PS, ashing with oxygen plasma can be used to remove the mask 500.

As described above, fine asperities 7R can be formed on the surface of the resin 7 by forming a fine mask 500 with block copolymer. The block copolymer may be made of material composed of an aromatic ring containing polymer chain and an acrylic polymer chain.

Alternatively, the block copolymer may be made of material composed of an aromatic ring containing polymer chain and an aliphatic double bond polymer chain. Examples of the latter may include polystyrene and polyisoprene, for example. In this case, after phase separation, polyisoprene can be removed by ozone treatment to form a pattern of polystyrene.

The embodiments of the invention have been described with reference to specific examples. However, the invention is not limited to these specific examples. For example, various variations of the semiconductor light emitting device and the semiconductor light emitting apparatus with respect to their structure and the like are also encompassed within the scope of the invention.

Figure 17:
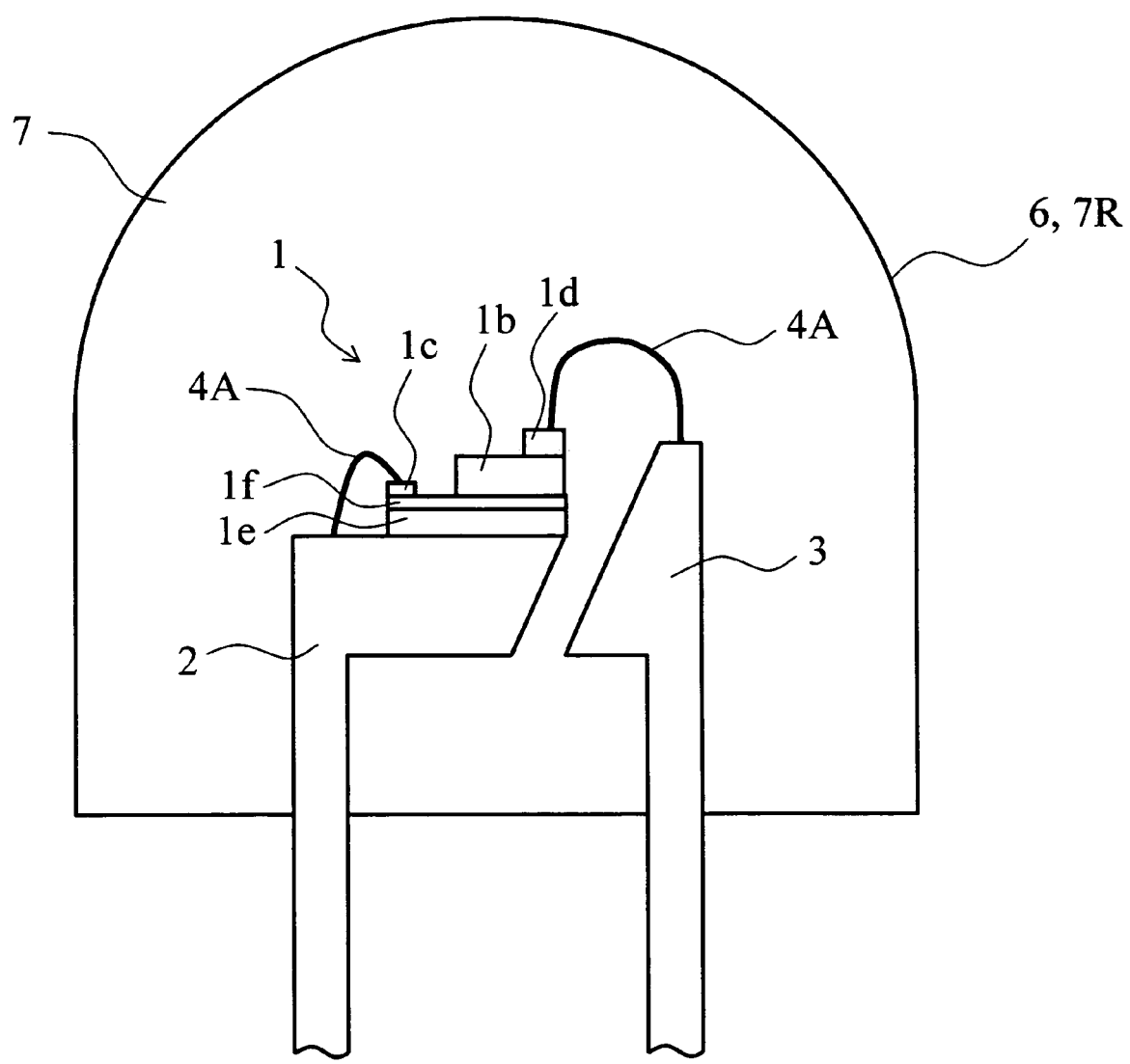
FIG. 17 is a schematic view showing an example of variation of the semiconductor light emitting apparatus.

FIG. 17 is a schematic view showing an example of variation of the semiconductor light emitting apparatus. More specifically, the semiconductor light emitting device 1 is formed on an insulating substrate 1e. In this case, part of an n-type semiconductor layer 1f formed on the substrate 1e may be exposed to provide an n-side electrode 1c, which may be connected to the lead 2 using a wire 4A. Such a semiconductor light emitting device may be, for example, a GaN-based semiconductor light emitting device formed on a sapphire substrate.

Figure 18:
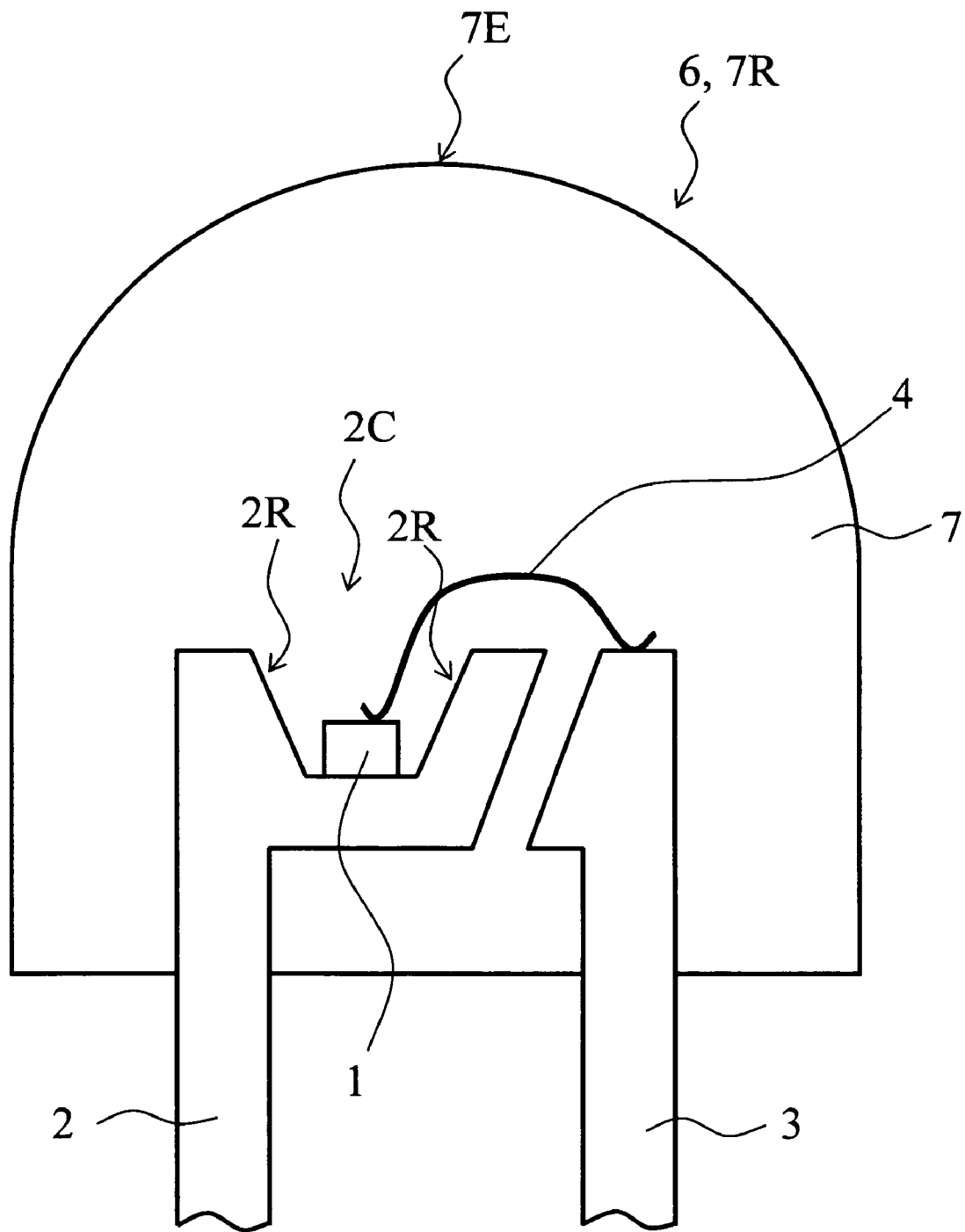
FIG. 18 is a schematic cross-sectional view showing another example of variation of the semiconductor light emitting apparatus.

FIG. 18 is a schematic cross-sectional view showing another example of variation of the semiconductor light emitting apparatus. The semiconductor light emitting apparatus of this example is a resin-sealed semiconductor light emitting apparatus called of "bullet-shaped" type, similar to those shown in FIGS. 1 and 3.

A cup portion 2C is provided on top of the lead 2. The semiconductor light emitting device 1 is mounted on the bottom surface of the cup portion 2C with adhesive or the like. It is connected to another lead 3 using a wire 4. The inner wall surface of the cup portion 2C constitutes a light reflecting surface 2R, which reflects light emitted from the semiconductor light emitting device 1. Thus the light can be extracted in an upward direction.

The periphery of the cup portion 2C is sealed with translucent resin 7. The light extraction surface 7E of the resin 7 forms a condensing surface, which can condense light emitted from the semiconductor light emitting device 1 as appropriate to achieve a predetermined light distribution.

Figure 19:
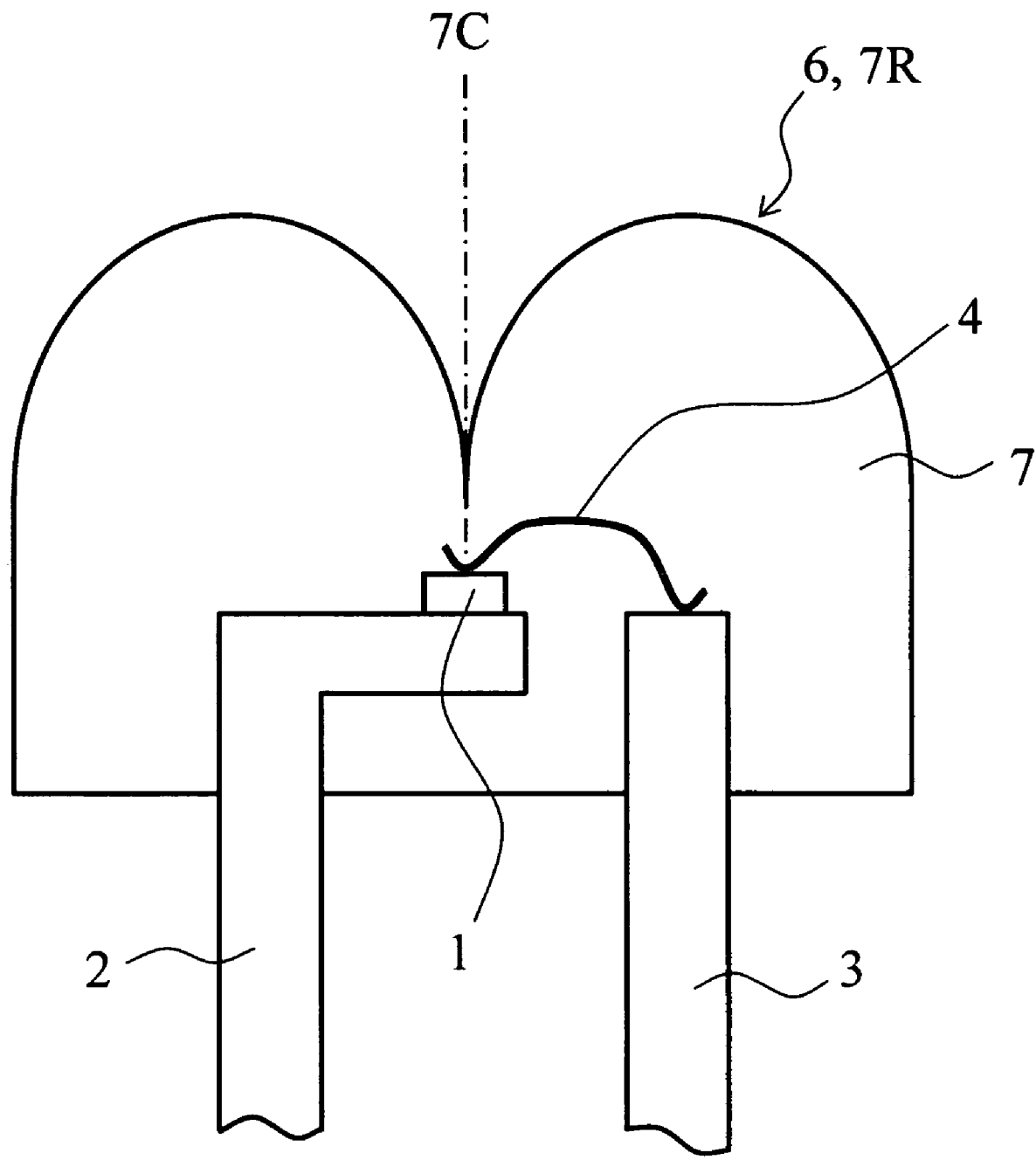
FIGS. 19 to 22 are schematic cross-sectional views showing still other examples of variation of the semiconductor light emitting apparatus.

FIG. 19 is a schematic cross-sectional view showing still another example of variation of the semiconductor light emitting apparatus. More specifically, in this example, the resin 7 sealing the semiconductor light emitting device 1 has rotational symmetry about its optical axis 7C. It is shaped as set back and converged toward the semiconductor light emitting device 1 at the center. The resin 7 of such shape results in light distribution characteristics where light is scattered at wide angles.

Figure 20:
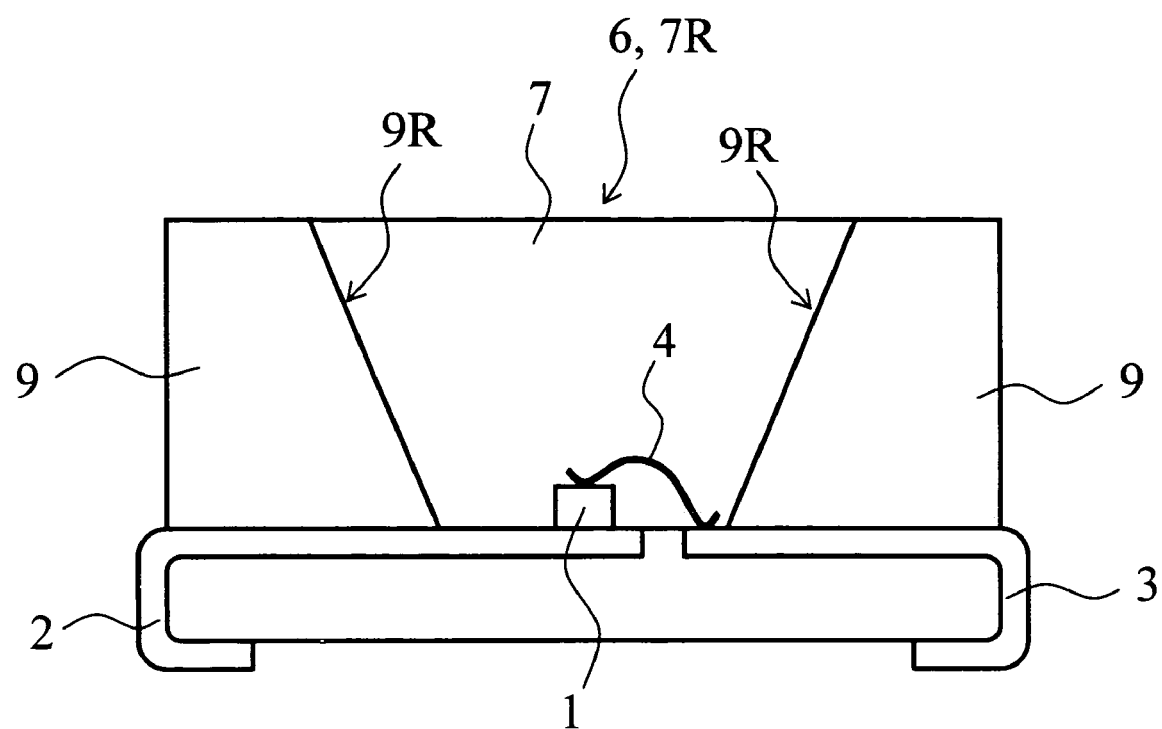

FIG. 20 is a schematic cross-sectional view showing still another example of variation of the semiconductor light emitting apparatus. More specifically, this example is called of the "surface mounted" type. The semiconductor light emitting device 1 is mounted on a lead 2, and connected to another lead 3 using a wire 4. These leads 2 and 3 are molded in first resin 9. The semiconductor light emitting device 1 is sealed with second translucent resin 7. The first resin 9 has an enhanced light reflectivity by dispersing fine particles of titanium oxide, for example. Its inner wall surface 9R acts as a light reflecting surface to guide light emitted from the semiconductor light emitting device 1 to the outside.

Figure 21:
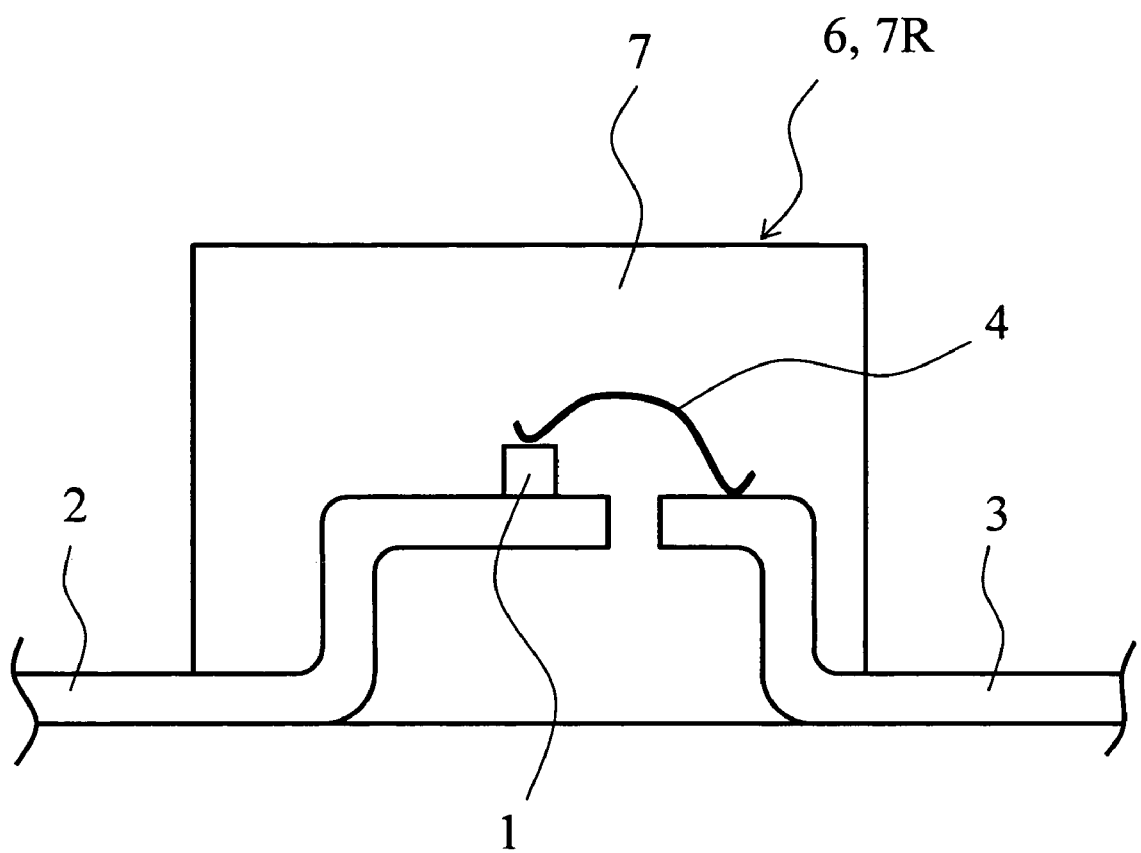

FIG. 21 is a schematic cross-sectional view showing still another example of variation of the semiconductor light emitting apparatus. More specifically, this example is also called of the "surface mounted" type. The semiconductor light emitting device 1 is mounted on a lead 2, and connected to another lead 3 using a wire 4. The tips of these leads 2 and 3, together with the semiconductor light emitting device 1, are molded in translucent resin 7.

Figure 22:
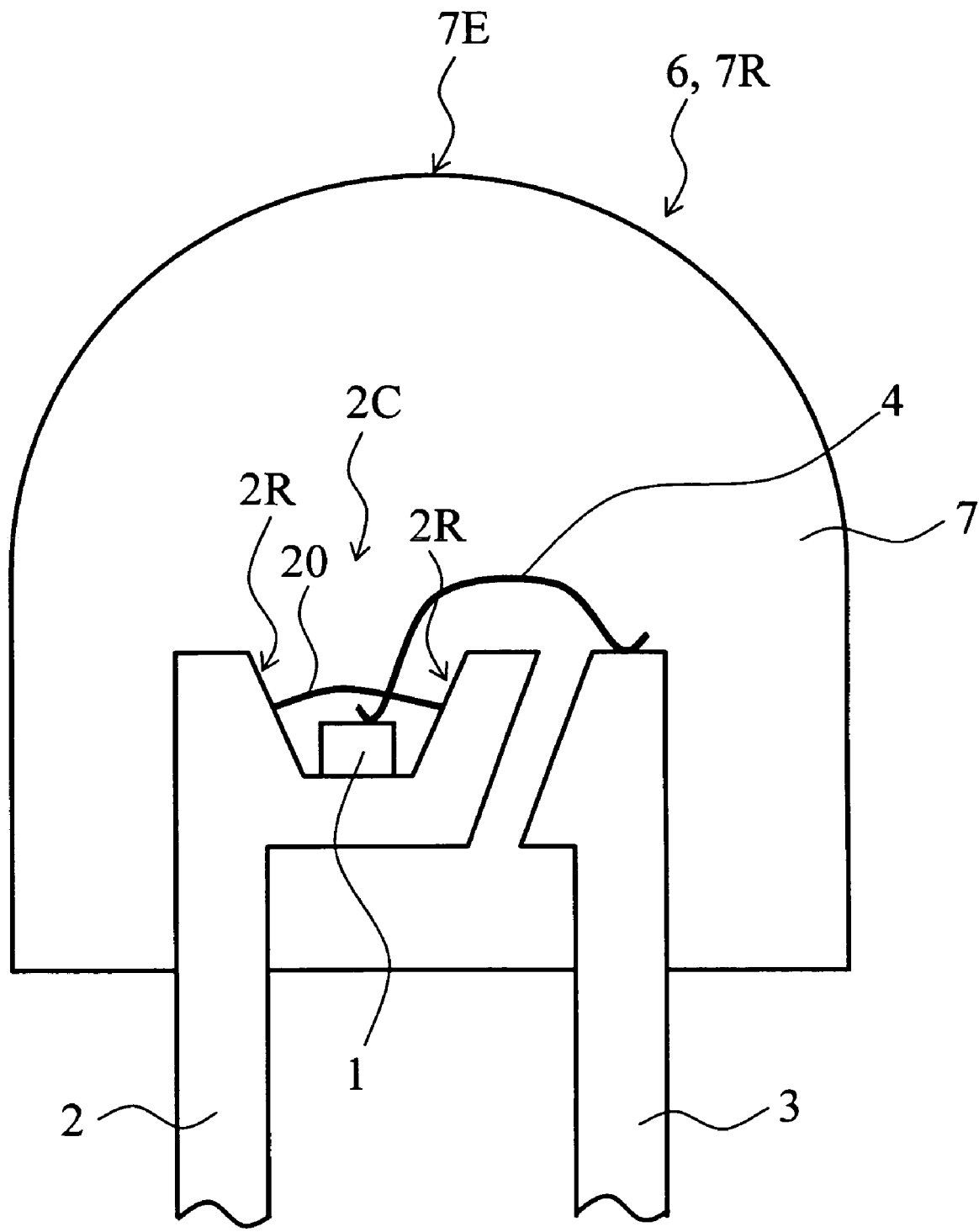

FIG. 22 is a schematic cross-sectional view showing still another example of variation of the semiconductor light emitting apparatus. In this example, a structure similar to that described above with reference to FIG. 18 is used. In addition, the semiconductor light emitting device 1 is covered with fluorescent material 20. The fluorescent material 20 serves to absorb light emitted from the semiconductor light emitting device 1 and convert its wavelength. For example, ultraviolet or blue primary light is emitted from the semiconductor light emitting device 1. The fluorescent material 20 absorbs this primary light and emits secondary light having different wavelengths such as red and green. For example, three kinds of fluorescent materials may be mixed, and the fluorescent materials 20 may absorb ultraviolet radiation emitted from the semiconductor light emitting device 1 to emit white light composed of blue, green, and red light.

The fluorescent material 20 may be applied to the surface of the semiconductor light emitting device 1, or may be contained in the resin 7.

In any semiconductor light emitting apparatus shown in FIGS. 17 to 22, the antireflective coating 6 as described above with reference to FIG. 1 or the asperities 7R as described above with reference to FIGS. 3 to 16 may be provided, and thereby light emitted from the semiconductor light emitting device 1 can be emitted from the resin 7 to the air while reducing reflection. As a result, light extraction efficiency can be significantly improved, and a semiconductor light emitting apparatus with high brightness can be offered.

On the other hand, any details of the layered structure constituting the semiconductor light emitting device 1 modified as appropriate by those skilled in the art are also encompassed within the scope of the invention, as long as they comprise the feature of the invention. For example, the active layer may be made of various materials including InGaAlP-based material, $Ga_xIn_{1-x}As_yN_{1-y}$-based ($0 \leq x \leq 1$, $0 \leq y < 1$) material, AlGaAs-based material, and InGaAsP-based material. Similarly, the cladding layers and optical guide layer may also be made of various materials.

Any shape and size of the semiconductor light emitting device 1 modified as appropriate by those skilled in the art are also encompassed within the scope of the invention, as long as they comprise the feature of the invention. The so-called "flip-chip" type semiconductor light emitting device may also be used.

Any other semiconductor light emitting apparatuses that can be modified and implemented as appropriate by those skilled in the art on the basis of the semiconductor light emitting apparatuses described above as the embodiments of the invention also belong to the scope of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor light emitting apparatus comprising:
a semiconductor light emitting device;
a resin that seals the semiconductor light emitting device; and
antireflective coating provided on a surface of the resin, the antireflective coating being made of material having an intermediate refractive index between the refractive index of the resin and the refractive index of air, wherein the antireflective coating is provided with a film thickness that generally conforms to an equation:

$$T = (m - \tfrac{1}{2}) \lambda / 2n$$

where $\lambda$ is a wavelength of light, m is an integer, n is the refractive index of the antireflective coating, and T is the film thickness.

2. The semiconductor light emitting apparatus as claimed in claim 1, wherein the antireflective coating has a thickness in a range of plus or minus 30 nanometers from the film thickness that conforms to the equation.

3. The semiconductor light emitting apparatus as claimed in claim 1, wherein the refractive index n of the antireflective coating generally conforms to an equation:

$$n = \sqrt{n_0 n_2}$$

where $n_0$ is the refractive index of the air, and $n_2$ is the refractive index of the resin.

4. The semiconductor light emitting apparatus as claimed in claim 1, wherein the antireflective coating is made from a material selected from a group consisting of polymers, oxides and fluorides.

5. The semiconductor light emitting apparatus as claimed in claim 1, wherein the resin has a light extraction surface that controls a distribution of a light emitted from the semiconductor light emitting device.

6. The semiconductor light emitting apparatus as claimed in claim 1, further comprising a fluorescent material that absorbs a light emitted from the semiconductor light emitting device and converts its wavelength.

* * * * *